US006621213B2

(12) United States Patent
Kawashima

(10) Patent No.: US 6,621,213 B2
(45) Date of Patent: Sep. 16, 2003

(54) ORGANIC ELECTROLUMINESCENCE DEVICE AND MANUFACTURING METHOD THEREFOR

(75) Inventor: Toshitaka Kawashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 141 days.

(21) Appl. No.: 09/933,499

(22) Filed: Aug. 20, 2001

(65) Prior Publication Data

US 2002/0043932 A1 Apr. 18, 2002

(30) Foreign Application Priority Data

Aug. 22, 2000 (JP) .................................... P2000-251493

(51) Int. Cl.$^7$ .............................. H01J 1/62; H01J 63/04
(52) U.S. Cl. .................... 313/506; 313/512; 313/509; 313/500; 313/504; 313/505; 313/503
(58) Field of Search ...................... 313/506, 512, 313/509, 500, 504, 505, 503

(56) References Cited

U.S. PATENT DOCUMENTS 5,652,067 A * 7/1997 Ito et al. ..................... 428/690
6,380,672 B1 * 4/2002 Yudasaka ..................... 313/504
6,500,295 B1 * 12/2002 Kubota ........................ 156/269

* cited by examiner

*Primary Examiner*—Vip Patel
*Assistant Examiner*—Matt Hodges
(74) *Attorney, Agent, or Firm*—Frommer Lawrence & Haug LLP; William S. Frommer

(57) ABSTRACT

An organic electroluminescence device in which device sealing is facilitated and in which a display employing the device as a light emitting device may be increased in size. The organic electroluminescence device includes a transparent substrate, an electrode film, a transparent electrode film, a first insulating film having an opening, an organic electroluminescence light emitting film, a metal electrode film and a second insulating film. The first and second insulating films exhibit gas barrier characteristics. The opening is tapered so that its opening degree is increased in a direction away from the transparent electrode film side. The transparent electrode film is electrically connected via electrode film to a first electrode formed on the second insulating film as it is passed through the first and second insulating films to be exposed on the second insulating film. The metal electrode film is electrically connected to a second electrode passed through the second insulating film to be exposed on the second insulating film.

6 Claims, 13 Drawing Sheets

ORGANIC ELECTROLUMINESCENCE DEVICE AND MANUFACTURING METHOD THEREFOR

BACKGROUND OF THE INVENTION

1. Field of the Invention

This invention relates to an organic electroluminescence device and a method for the manufacturing thereof.

2. Description of Related Art

Recently, an organic electroluminescence display, employing an organic electroluminescence device, referred to below as an organic EL device, is stirring up notice.

An illustrative structure of the organic electroluminescence (EL) display is shown in FIGS. 1 and 2. This organic EL display 20 is comprised of a transparent substrate 21, a plurality of transparent electrodes 22, arranged in stripes, as anode, on the transparent substrate 21, a plurality of organic layers 23, each made up of a positive hole transport layer and a light emitting layer, formed at right angle to the transparent electrodes 22 and a plurality of cathode 24 formed on the organic layers 23, whereby organic EL devices are formed at the intersecting points of the transparent electrodes 22 and the cathodes 24 to form a light emitting area A comprised of a matrix of these organic EL devices, and a contact electrode B is formed in the vicinity of the light emitting area A for taking out the light emitting area to an external circuit or to an inner driving circuit.

Although not shown, an insulating layer is usually provided between the neighboring transparent electrodes 22, whereby the shorting across neighboring transparent electrodes 22 and that across the transparent electrodes 22 and the cathodes 24 may be prevented from occurring.

In such organic EL display, there is, for example, a single hetero type organic EL device 30, shown in FIG. 16, as an organic EL device constructed at an intersection of the transparent electrode 22 and the cathode 24. This organic EL device 30 includes a transparent substrate 21, such as a glass substrate, on which there are sequentially formed an anode of, for example, ITO (indium tin oxide), an organic layer 23, made up of a positive hole transport layer 23a and a light emitting layer 23b, and a cathode 24, arranged in this order.

If, in the above-described organic EL device 30, a positive voltage and a negative voltage are applied to the anode and cathode, the positive holes implanted from the anodes reach the light emitting layer 23b through the positive hole transport layer 23a, whilst the electrons implanted at the cathode reach the light emitting layer 23b, so that electron-positive hole recombination occurs in the light emitting layer 23b. The light of a pre-set wavelength is emitted at this time and radiated from the transparent substrate 21 side to outside as indicated by arrow in FIG.3.

However, an organic fluorescent solid material, as a material of the light emitting layer of the organic EL device, is vulnerable to moisture or to oxygen, whilst the cathode provided on the light emitting layer tends to be deteriorated in characteristics due to oxidation. Thus, if the conventional organic EL device is driven in atmospheric air, it is rapidly deteriorated in light emitting characteristics to form a dark point not emitting the light. Thus, in order to realize a practically useful organic EL device or organic EL display, the device needs to be sealed to elongate its service life to prevent intrusion of moisture or oxygen into the organic layer as well as to prevent oxidation of the counter-electrodes.

As a method for sealing the device, there has so far been proposed a method of annexing a de-oxidation agent, such as barium oxide, in a metal cap, on the reverse side of the organic EL device display, to seal dry nitrogen. However, this method complicates the process for sealing the device to raise production difficulties.

Moreover, since a driving circuit is mounted in the vicinity of the display device in the conventional passive matrix system, difficulties are met in the conventional passive matrix system in increasing the screen size due to, for example, voltage drop caused by wiring resistance of the driving circuit.

SUMMARY OF THE INVENTION

It is therefore an object of the present invention to provide an organic EL devices which may be sealed readily and which permits the display employing the device to be increased in size, and a method for the manufacturing of the organic EL device.

In one aspect, the present invention provides an organic electroluminescence device includes a transparent substrate, an electrode film formed on the transparent substrate, a transparent electrode film formed on the electrode film, a first insulating film formed on the transparent electrode film and having an opening over the transparent electrode film, an organic electroluminescence light emitting film formed over a portion of the transparent electrode film exposed from the opening in the first insulating film, the organic electroluminescence light emitting film being larger in size than the opening and being formed over the first insulating film, a metal electrode film formed on the organic electroluminescence light emitting film and a second insulating film formed on the metal electrode film so as to be larger in size than both the organic electroluminescence light emitting film and the metal electrode film.

In the organic electroluminescence device according to the present invention, the first and second insulating films exhibit gas barrier characteristics, and the opening is tapered so that its opening degree is increased in a direction away from the transparent electrode film side. The transparent electrode film is electrically connected through the electrode film to a first electrode passed through the first and second insulating films so as to be exposed on the second insulating film. The metal electrode film is electrically connected to a second electrode passed through the second insulating film so as to be exposed on the second insulating film.

In the organic electroluminescence device according to the present invention, in which the first and second insulating films exhibit gas barrier characteristics, it is possible to prevent intrusion of moisture or oxygen into the inside of the device, by a simplified structure, without sealing the device. Moreover, in the present organic electroluminescence device, in which the first and second electrodes are exposed on a device surface opposite to the transparent substrate, the driving circuit substrate for driving the substrate can be arranged on the back side of the device.

In another aspect, the present invention provides a method for the manufacturing of an organic electroluminescence device including an electrode film forming step of forming an electrode film on a transparent substrate, a transparent electrode film forming step of forming a transparent electrode film on the electrode film, a first insulating film forming step of forming a first insulating film exhibiting gas barrier characteristics on the transparent electrode film, an opening forming step of forming an opening in the first insulating film for exposing a portion of the transparent electrode film, a step of forming an organic electroluminescence light emitting film on the portion of the transparent electrode film exposed from the opening in the first insulating film so that the organic electroluminescence light emitting film will be extended over the first insulating film to a size larger than that of the opening, a metal electrode film forming step of forming a metal electrode film on the organic electroluminescence light emitting film, a second insulating film forming step of forming a second insulating film exhibiting gas barrier characteristics so that the second insulating film will be extended over the metal electrode film to a size larger than that of both the organic electroluminescence light emitting film and the metal electrode film, a first electrode forming step of forming a first electrode so that the first electrode is passed through the first and second insulating films so as to be exposed on the second insulating film and electrically connecting the first electrode to the transparent electrode film through the electrode film, a second electrode forming step of forming a second electrode so that the second electrode is passed through the second insulating film so as to be exposed on the second insulating film and electrically connecting the second electrode to the metal electrode film and a driving circuit connecting step of connecting a driving circuit to the first electrode and/or to the second electrode and mounting the driving circuit on an electrode electrically connected to the driving circuit. In the opening forming step, the opening is formed so that its opening degree is larger in a direction away from the transparent electrode film side.

In the method for the manufacturing of the organic electroluminescence device according to the present invention, since the first and second insulating films exhibiting gas barrier characteristics are used, a device in which moisture or oxygen is prevented from being intruded into the inside of the device may be prepared by a simplified structure, without sealing the device. Moreover, in the present method, since the first and second electrodes are exposed on a device surface opposite to the transparent substrate, the driving circuit substrate for driving the substrate can be arranged on the back side of the device.

According to the present invention, an organic electroluminescence device can be prepared and sealed more readily than in the conventional system. Since the organic electroluminescence device can be prepared without using metal caps, de-oxidation agents or dry nitrogen, the manufacturing device may be simplified, at the same time as integrated production in vacuum may be achieved.

In addition, since the electrodes for driving the organic electroluminescence device may be taken out from the back side, the device may be integrated to a high density.

DESCRIPTION OF THE PREFERRED EMBODIMENTS

Figure 1:
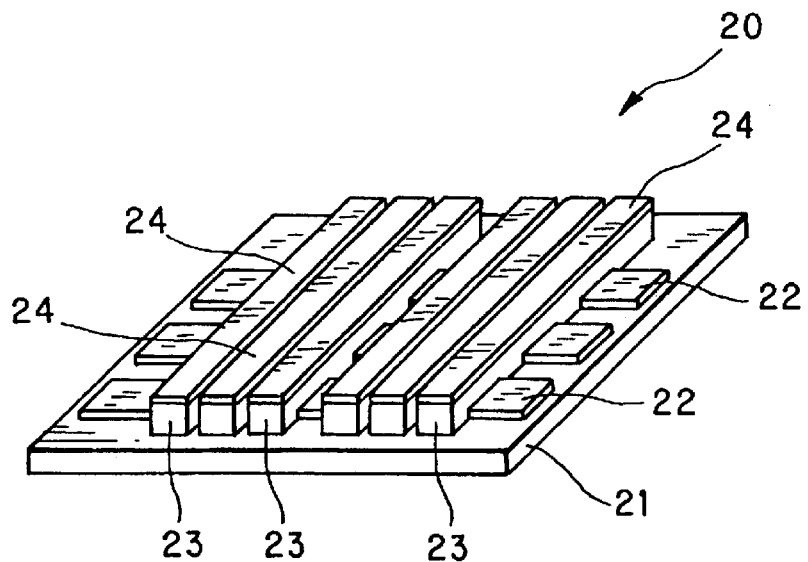
FIG. 1 is a perspective view showing an illustrative structure of a conventional organic EL display
Figure 2:
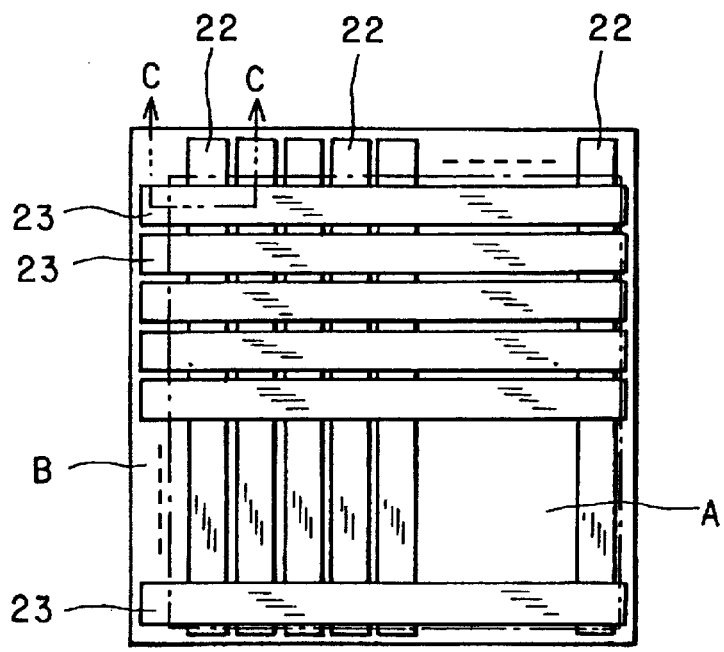
FIG. 2 is a plan view showing an illustrative structure of a conventional organic EL display.
Figure 3:
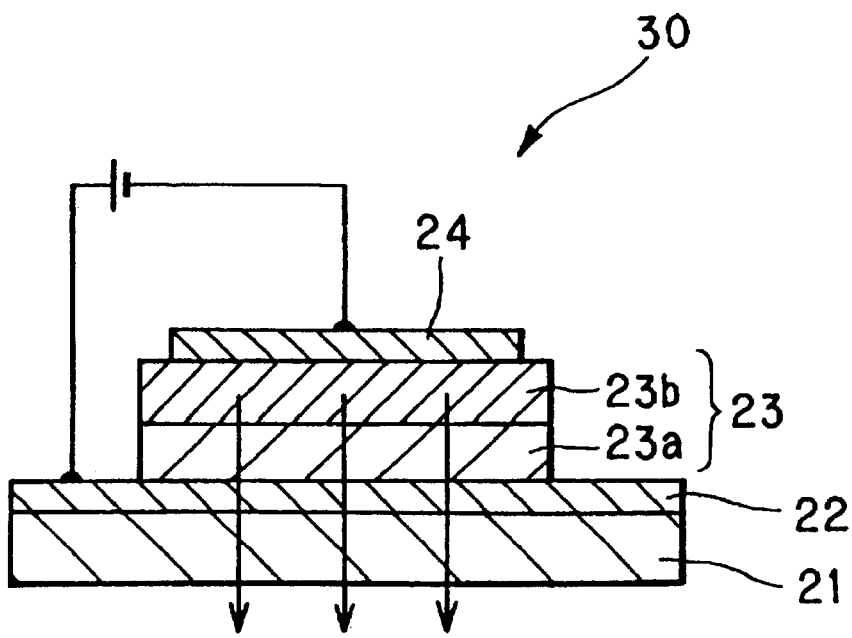
FIG. 3 is a cross-sectional view showing an illustrative structure of an organic EL device used in the organic EL display shown in FIGS. 1 and 2.

Referring to the drawings, preferred embodiments of according to the present invention will be explained in detail.

Figure 4:
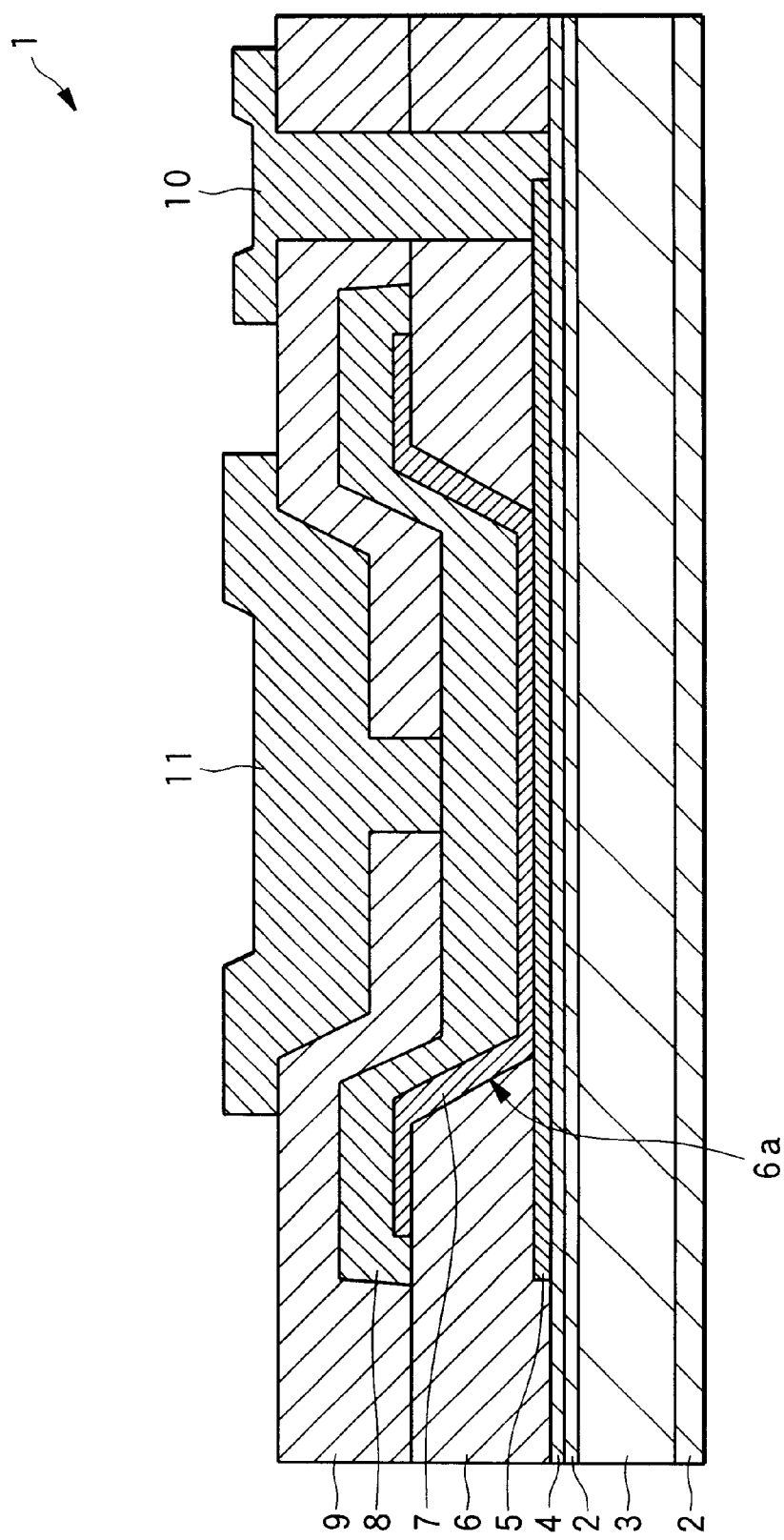
FIG. 4 is a cross-sectional view showing an illustrative structure of an organic EL device according to the present invention.

FIG. 4 shows an illustrative structure of an organic EL device 1 embodying the present invention.

This organic EL device 1 is made up of a transparent substrate 3, on both sides of which are formed gas barrier films 2, an electrode film 4 formed on one surface of the transparent substrate 3, a transparent electrode film 5 formed on the electrode film 4, a first insulating film 6, formed on the transparent electrode film 5, an organic EL film 7, formed on the first insulating film 6 and on the transparent electrode film 5, a metal electrode film 8, formed on the organic EL film 7 and a second insulating film 9.

There is no particular limitation to the transparent substrate 3 provided that the function as a display device is met. For example, the transparent substrate 3 may be formed of any suitable known materials transparent to visible light, such as glass or a plastic sheet or film.

In the organic EL device 1, the gas barrier films 2 against gases, such as moisture or oxygen, are provided on both sides of the transparent substrate 3. By providing the gas barrier films 2 on both sides of the transparent substrate 3, it is possible to prevent the moisture or oxygen from being intruded into the inside of the device to prevent deterioration of the organic EL material. These gas barrier films 2 are preferably endowed with anti-reflection characteristics. With the gas barrier films 2 having anti-reflection characteristics, it is possible to prevent reflection of the emitted light on the transparent substrate 3 to construct the organic EL device 1 with high transmittance.

Figure 5:
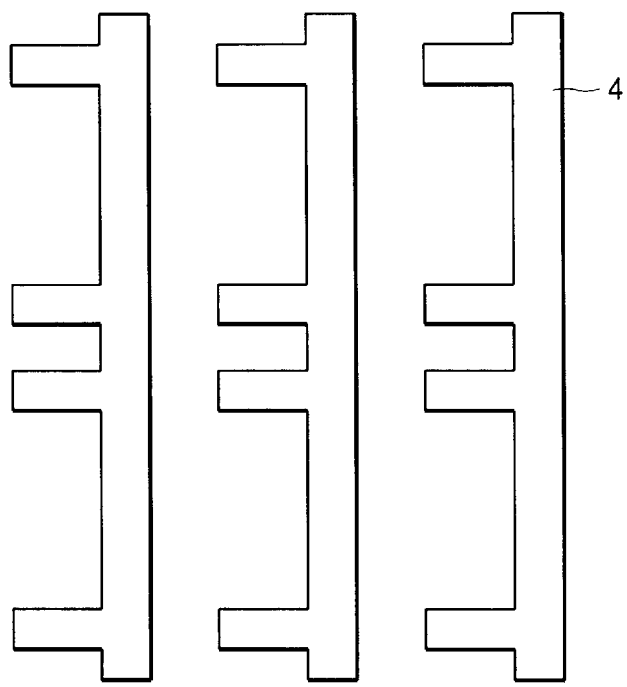
FIG. 5 is a plan view showing an exemplary shape of an electrode film shown in FIG. 4.
Figure 6:
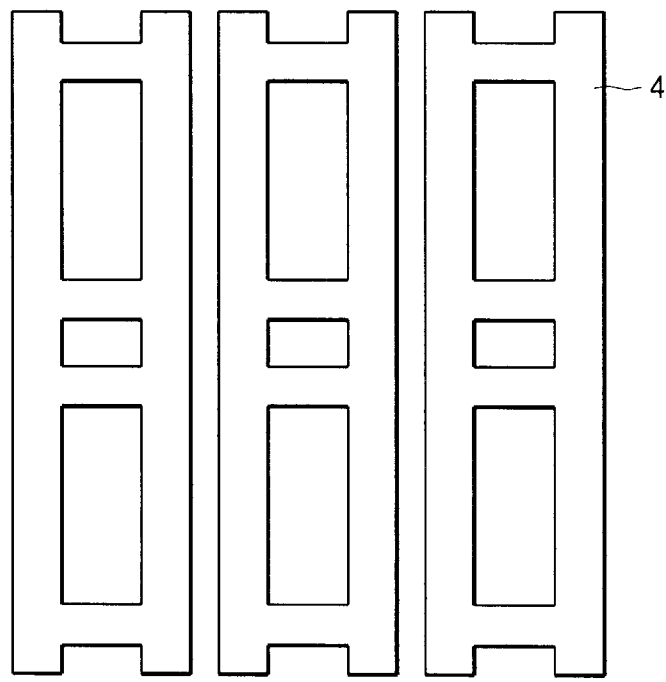
FIG. 6 is a plan view showing another exemplary shape of the electrode film shown in FIG. 4.

The electrode film 4 is formed in a comb shape, as shown in FIG. 5, or in a ladder shape, as shown in FIG. 6. This electrode film 4 is connected to a first electrode 10 formed to pass through the first insulating film 6 and the second insulating film 9. This first electrode 10 operates as an external anode of the organic EL device 1. That is, the electrode film 4 serves as an auxiliary electrode for supplying the current to the transparent electrode film 5 formed on the electrode film 4.

In constructing the display using the organic EL device 1 as the light emitting element, a driving circuit for actuating the organic EL device 1 needs to be provided laterally of the organic EL device 1, in the conventional passive matrix system, thus proving a hindrance in increasing the display size, due to voltage drop caused by the wiring resistance of the driving circuit.

In the organic EL device 1, according to the present invention, the first electrode 10, operating as a terminal for capturing the current from outside, and a second electrode 11, as later explained, are passed through the first insulating film 6 or the second insulating film 9 to the opposite side of the device with respect to the transparent substrate 3. Thus, the driving circuit for driving the organic EL device 1 may be provided not on the lateral side but on the back side of the device. So, with the display employing this organic EL device 1, there is no risk of the voltage drop caused by the wiring resistance of the driving circuit to enable the display to be increased in size.

Moreover, the electrode film 4 and the first electrode 10 also have the function of a gas barrier against the moisture or oxygen. By the electrode film 4 and the first electrode 10 having the gas barrier characteristics, it is possible to prevent the moisture or oxygen from intruding into the inside of the device to prevent deterioration of the organic EL film 7.

Figure 7:
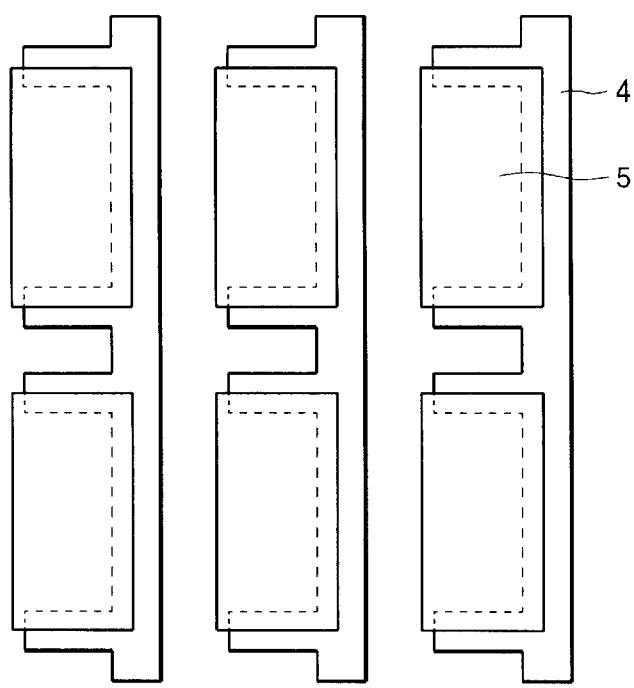
FIG. 7 is a plan view showing an exemplary transparent electrode film formed on the electrode film shown in FIG. 6.
Figure 8:
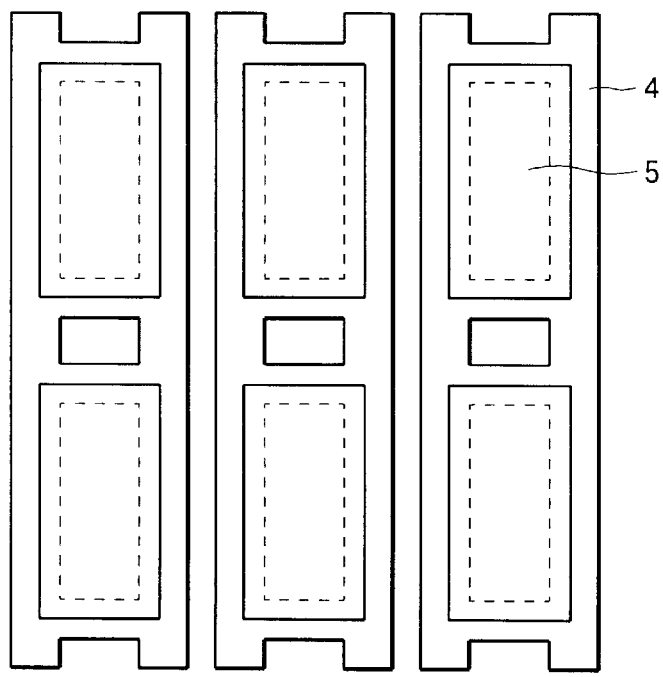
FIG. 8 is a plan view showing another exemplary transparent electrode film formed on the electrode film shown in FIG. 6.

The transparent electrode film 5 serves as an anode of the organic EL device 1 and is formed e.g., of ITO (indium tin oxide). Meanwhile, this transparent electrode film 5 is formed as an island for extending over the opening of the electrode film 4 formed in the comb or ladder shape and is connected to the first electrode 10 through the electrode film 4, as shown in FIGS. 7 and 8.

The first insulating film 6 is formed with an opening 6a over the transparent electrode film 5 and operates for separating neighboring devices.

The first insulating film 6 is forwardly tapered in which the opening degree of the opening 6a is increased in a direction away from the transparent electrode film 5 side. If the first insulating film 6 is not tapered, the electrical field is concentrated in the ends of the transparent electrode film 5, organic EL film 7 and the metal electrode film 8 when the current is caused to flow to drive the organic EL device 1. Thus, there is the risk of the insulation being destructed to cause shorting to be produced across the transparent electrode film 5 and the metal electrode film 8. By the first insulating film 6 being forwardly tapered, it is possible to provide the insulation between the transparent electrode film 5, organic EL film 7 and the metal electrode film 8 to prevent the shorting across the transparent electrode film 5 and the metal electrode film 8 otherwise caused by concentration of the electrical field at the ends of the transparent electrode film 5, organic EL film 7 and the metal electrode film 8.

The material of the first insulating film 6 may, for example, be SiN, which exhibits not only the insulating properties but also the gas barrier function against the moisture or oxygen. By the first insulating film 6 having gas barrier characteristics, it is possible to prevent intrusion of the moisture or oxygen into the inside of the device to prevent deterioration of the organic EL film 7.

The organic EL film 7 is formed over the transparent electrode film 5 exposed from the opening 6a of the first insulating film 6 so as to surpass the opening 6a to extend over the first insulating film 6. This organic EL film 7 is of a multi-layered structure comprised of a positive hole transport layer and a light emitting layer. If the current is supplied across the transparent electrode film 5 (anode) and the metal electrode film 8 (cathode), the positive holes implanted from the metal electrode film 8 reach the light emitting layer through the positive hole transport layer, whilst the electrons implanted from the transparent electrode film 5 reach the light emitting layer, such that electron- positive hole recombination occurs in the light emitting layer. At this time, the light having a pre-set wavelength is emitted and radiated outwards from the transparent substrate 3 side.

The positive hole transport layer may be formed of any suitable known materials. Examples of these materials include, for example, N,N'-di($\alpha$-naphthyl)-N,N'-diphenyl-1, 1'-biphenyl-4,4'-diamine.

The positive light emitting layer may be formed of any suitable known material. Examples of these materials include, for example, 4 4'-bis(2, 2'-diphenyl vinylene) biphenyl and 4,4'-bis(2-carbazole vinylene) biphenyl.

The metal electrode film 8 operates as a cathode for the organic EL device 1 and is formed over the organic EL film 7 to a size larger than that of the organic EL film 7. This metal electrode film 8 is formed e.g., of lithium fluoride (LiF). It is noted that this metal electrode film 8 is connected to the second electrode 11 passed through the second insulating film 9.

The second insulating film 9 is formed for extending cover the entire device surface. The material of these 9 may, for example, be SiN or AlN. This second insulating film 9 has not only insulating properties but also a gas barrier function against moisture or oxygen. With the insulating film having gas barrier characteristics, it is possible prevent intrusion of moisture or oxygen into the inside of the device to prevent deterioration of the organic EL film 7.

The second electrode 11 is formed e.g., of aluminum. This second electrode 11 is passed through the second insulating film 9 so as to be connected to the metal electrode film 8 to serve as an external cathode for the organic EL device 1. Similarly to the first electrode 10, the second electrode 11 is taken out from the back side of the display screen to enable the display employing the organic EL device 1 to be increased in size. Moreover, this second electrode 11 also has the gas barrier function against the moisture or oxygen. By the second electrode 11 having the gas barrier properties, it is possible prevent intrusion of moisture or oxygen into the inside of the device to prevent deterioration of the organic EL film 7.

Figure 9:
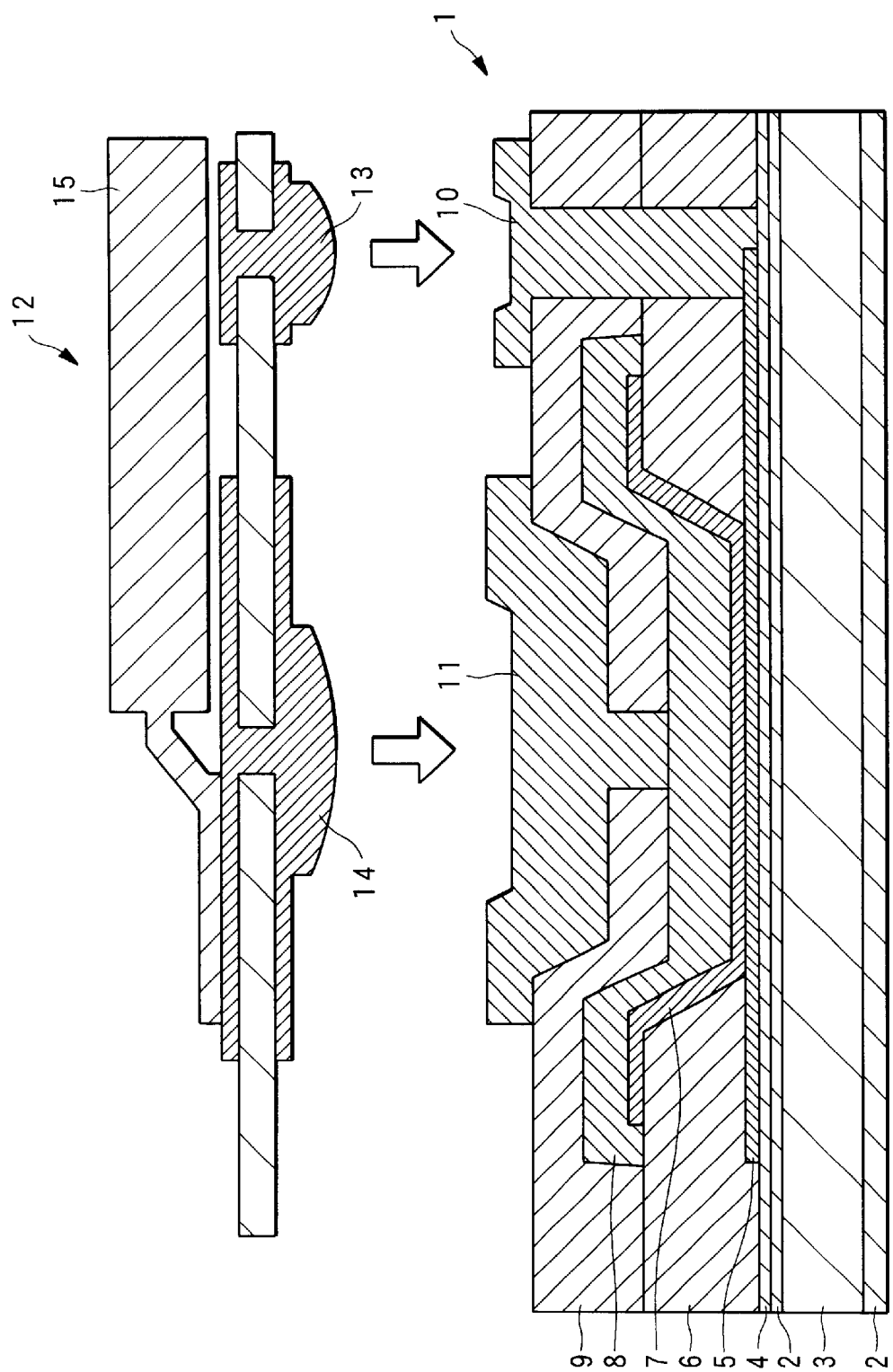
FIG. 9 is a cross-sectional view showing the state of arraying a driving circuit substrate on the back side of the organic EL device according to the present invention.

These first and second electrodes 10, 11 are connected to the terminals 13, 14 provided in a driving circuit substrate 12 by e.g., a bump, as shown in FIG. 9. The organic EL device 1 is driven by transmitting a device driving signal thereto from the driving circuit substrate 12. On this driving circuit substrate 12 is mounted e.g., a driving circuit IC 15.

In the organic EL device 1, according to the present invention, the organic EL film 7 is sealed by the gas barrier films 2, first insulating film 6, each having the gas barrier properties, metal electrode film 8 and the second insulating film 9, from both sides, to prevent the intrusion of the moisture or oxygen into the inside of the device substantially completely to prevent deterioration of the organic EL film 7.

Moreover, in this organic EL device 1, in which the component films of the organic EL device 1 are endowed with gas barrier properties, it is possible to simplify not only the device structure as compared to the conventional organic EL device 1 adapted for sealing the entire device from outside, but also the process for the manufacturing of the device.

Moreover, since the organic EL device 1 is adapted for taking out the electrode terminal not from the lateral side but also from the back side of the display screen, the driving circuit for actuating the organic EL device 1 can be arranged on the back side of the device, so that, when the organic EL device 1 is used as a light emitting device to construct a display, the display, thus constructed, may be increased in size.

Figure 10:
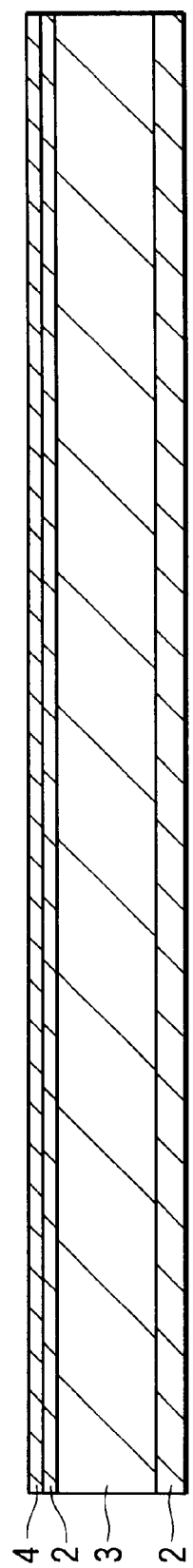
FIG. 10 is a cross-sectional view showing the state of forming the electrode film on the transparent substrate for illustrating the method for the manufacturing of the organic EL device according to the present invention.

The organic EL device 1 may be produced e.g., as follows:

On the transparent substrate 3, on both sides of which the gas barrier films 2 are formed, a metal film is formed to form the electrode film 4, as shown in FIG. 10. This electrode film 4 is formed to e.g., a comb shape or to a ladder shape, as shown in FIGS. 5 an 6, respectively.

Figure 11:
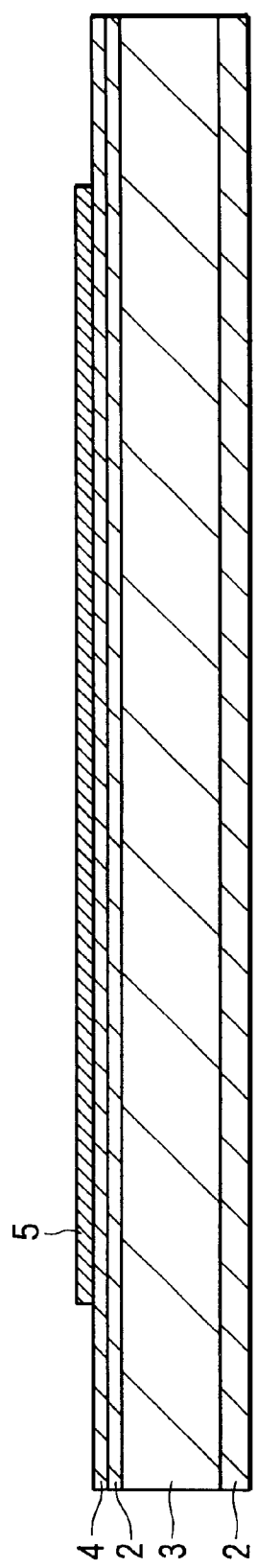
FIG. 11 is a cross-sectional view showing the state of forming the transparent electrode film on the electrode film for illustrating the method for the manufacturing of the organic EL device according to the present invention.

An ITO film then is deposited on the electrode film 4 to form the transparent electrode film 5, as shown in FIG. 11. This transparent electrode film 5 is formed in the shape of an island over the opening of the electrode film 4, which is comb- or ladder-shaped, as shown in FIGS. 7 and 8. The transparent electrode film 5 operates as an anode of the organic EL device 1.

Figure 12:
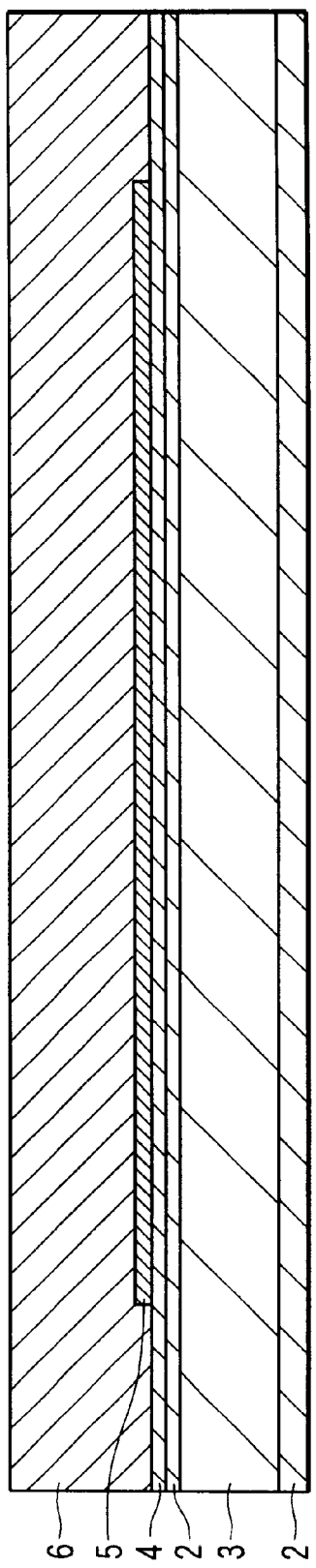
FIG. 12 is a cross-sectional view showing the state of forming the first insulating film on the transparent electrode film for illustrating the method for the manufacturing of the organic EL device according to the present invention.

Then, the first insulating film 6 is formed on the entire surface of the transparent substrate 3, by depositing a material having not only the insulating properties but also the gas barrier properties against the water or oxygen, such as SiN, as shown in FIG. 12. This first insulating film 6 operates as a partition for separating neighboring devices from each other.

Figure 13:
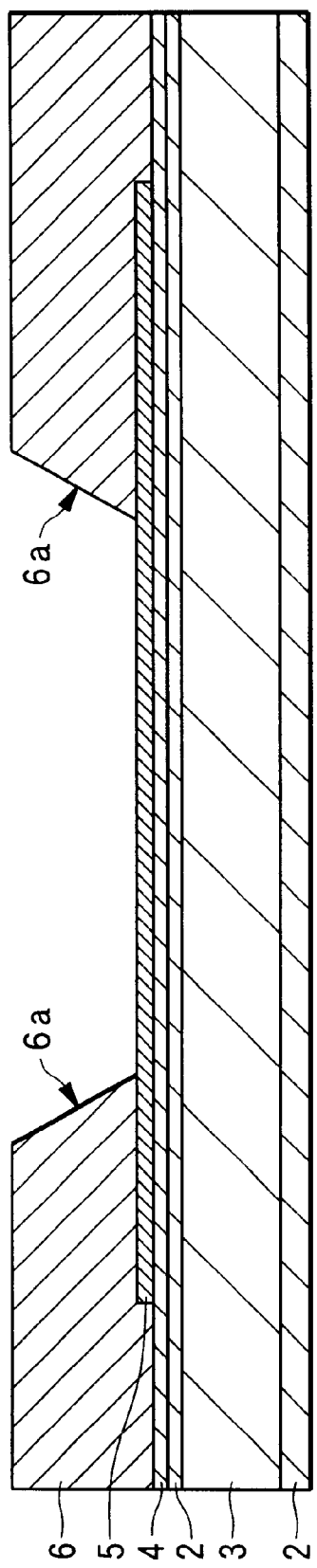
FIG. 13 is a cross-sectional view showing the state of an opening formed in the first insulating layer for illustrating the method for the manufacturing of the organic EL device according to the present invention.

The opening 6a is then formed in the first insulating film 6 on the inner side of a film-forming area of the transparent electrode film 5 by a technique, such as etching, as shown in FIG. 13. The opening 6a is forwardly tapered, that is, opening degree of the opening 6 is increased in a direction away from the transparent electrode film 5 side.

Figure 14:
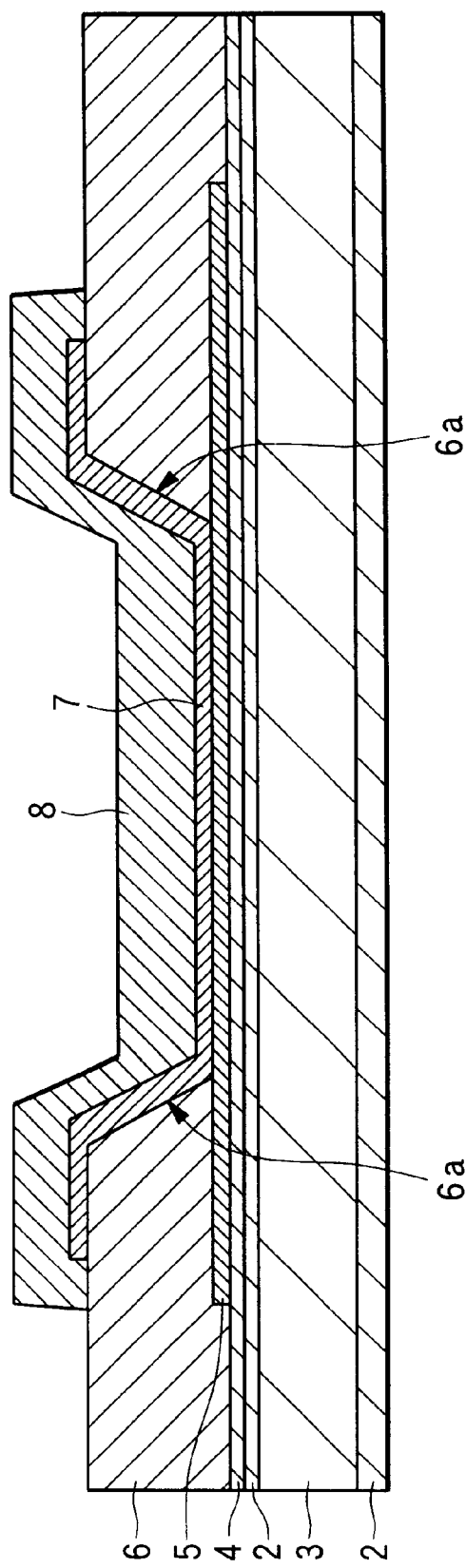
FIG. 14 is a cross-sectional view showing an organic EL film and a metal electrode film formed on the first insulating layer for illustrating the method for the manufacturing of the organic EL device according to the present invention.

The positive hole doped layer, the positive hole transport layer, the light emitting layer, the electron transport layer and the electron doped layer then are deposited to form the organic EL film 7 so that the organic EL film 7 will be larger in size than the opening 6a so as to extend over the first insulating film 6, as shown in FIG. 14. On the organic EL film 7 is further deposited e.g., LiF to form the metal electrode film 8. Since the first insulating film 6 is forwardly tapered, it is possible to prevent shorting from occurring across the organic EL film 7, the metal electrode film 8, operating as a cathode, and the transparent electrode film 5. operating as an anode.

Figure 15:
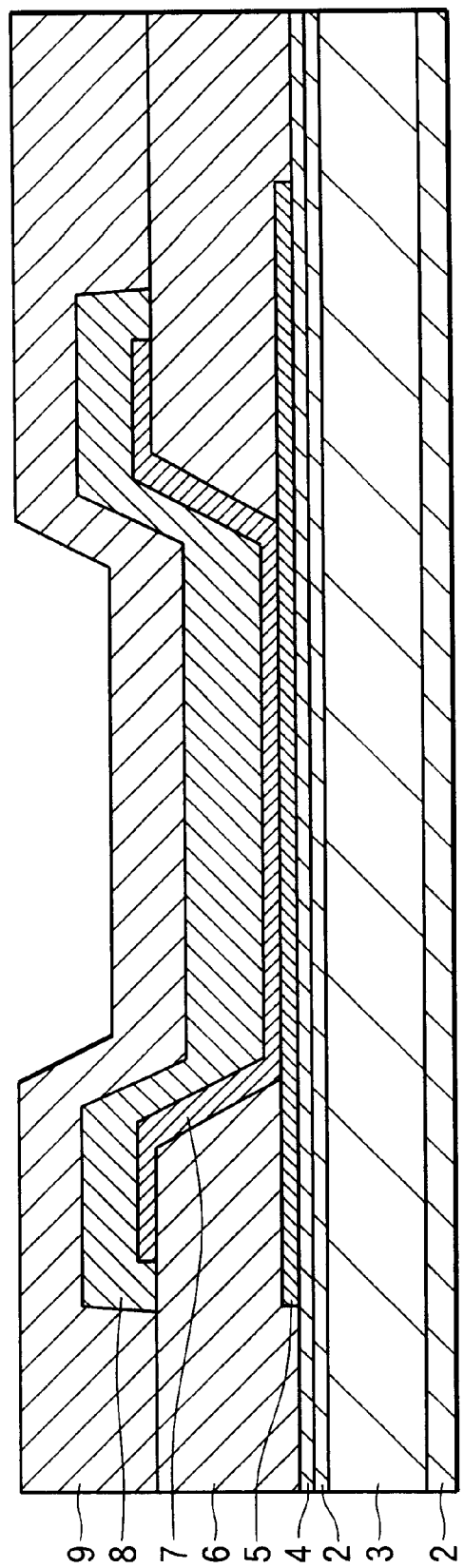
FIG. 15 is a cross-sectional view showing a second insulating film formed on the organic EL film and the metal electrode film for illustrating the method for the manufacturing of the organic EL device according to the present invention.

Then, as shown in FIG. 15, a material having not only the insulating properties but also the gas barrier function against moisture or oxygen, such as SiN or AlN, is deposited on the entire surface of the metal electrode film 8, to form the second insulating film 9, so that the second insulating film 9 will be larger in size than the metal electrode film 8.

Figure 16:
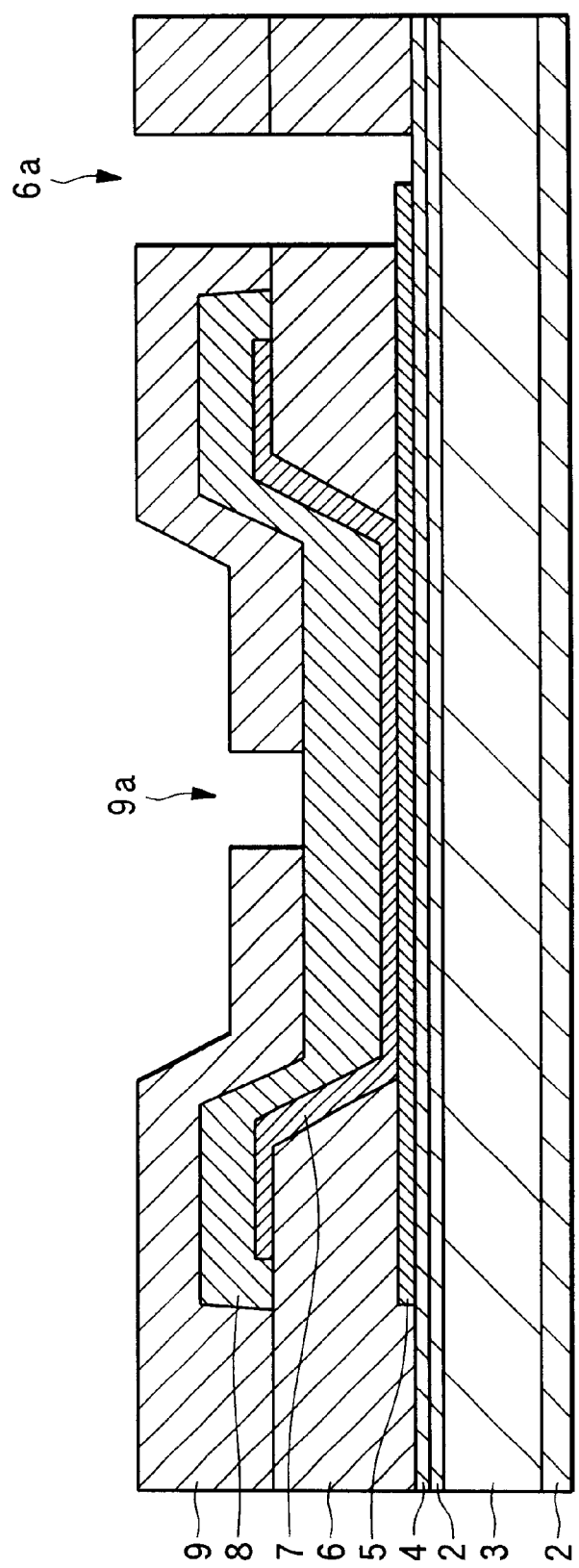
FIG. 16 is a cross-sectional view showing the state of a hole formed in the first or second insulating film for illustrating the method for the manufacturing of the organic EL device according to the present invention.

Then, openings 6a, 9a are bored by e.g., etching in the first insulating film 6 and in the second insulating film 9, respectively, as shown in FIG. 16. In these openings 6a, 9a is deposited e.g., aluminum, to form the first electrode 10 connected to the electrode film 4 and to the transparent electrode film 5 to serve as an external anode, as well as to form the second electrode 11 connected to the metal electrode film 8 to serve as an external anode, as shown in FIG.4.

The above competes the organic EL device 1 embodying the present invention. Although there is no particular limitation to the method for forming the constituent films of the organic EL device 1, vacuum deposition or CVD is most preferred.

In the organic EL device 1, thus prepared, in which the organic EL film 7 is sealed from both sides by the gas barrier films 2 and the first insulating film 6 on one hand and by the metal electrode film 8 and the second insulating film 9 on the other hand, these respective films having gas barrier characteristics, whereby it is possible to prevent intrusion of moisture or oxygen into the inside of the device substantially completely to suppress deterioration of the organic EL film 7.

Moreover, in the organic EL device 1, in which the constituent films of the organic EL device 1 are endowed with gas barrier characteristics, the device structure can be simpler than in the conventional organic EL device sealed from outside in its entirety, so that it is possible to simplify not only the device structure but also the manufacturing process.

In addition, in this organic EL device 1, in which the electrode terminals are taken out not from the lateral side of the display screen, but from its back side, the driving circuit for actuating the organic EL device 1 may be mounted on the back side of the device, with the result that, if the organic EL device 1 is used as a light emitting device to construct a display, the display, so constructed, may be increased in size.

In driving this organic EL device 1, the first electrode 10 and the second electrode 11 are connected by e.g., bumps to the first and second terminals 13, 14, respectively, provided on the driving circuit substrate 12, having the driving circuit IC 15 mounted thereon, as shown in FIG. 9. The organic EL device 1 may be actuated by device driving signals transmitted thereto from the driving circuit substrate 12.

What is claimed is:

1. An organic electroluminescence device comprising:

a transparent substrate;

an electrode film formed on said transparent substrate;

a transparent electrode film formed on said electrode film;

a first insulating film formed on said transparent electrode film and having an opening over said transparent electrode film;

an organic electroluminescence light emitting film formed over a portion of said transparent electrode film exposed from said opening in said first insulating film, said organic electroluminescence light emitting film being larger in size than said opening and being formed over said first insulating film;

a metal electrode film formed on said organic electroluminescence light emitting film; and a second insulating film formed on said metal electrode film so as to be larger in size than both said organic electroluminescence light emitting film and said metal electrode film;

said first and second insulating films exhibiting gas barrier characteristics;

said opening being tapered so that its opening degree is increased in a direction away from the transparent electrode film side;

said transparent electrode film being electrically connected through said electrode film to a first electrode passed through said first and second insulating films formed so as to be exposed on said second insulating film, said metal electrode film being electrically connected to a second electrode passed through said second insulating film formed so as to be exposed on said second insulating film.

2. The organic electroluminescence device according to claim 1 wherein a gas barrier film is formed on at least one surface of said transparent substrate.

3. The organic electroluminescence device according to claim 2 wherein said gas barrier film has anti-reflection characteristics.

4. The organic electroluminescence device according to claim 1 wherein said electrode film is in a comb shape or in a ladder shape.

5. The organic electroluminescence device according to claim 1 wherein said organic electroluminescence light emitting film is a multi-layered organic layer including a positive hole doped layer, a positive hole transport layer, a light emitting layer, an electron transport layer and an electron doped layer.

6. The organic electroluminescence device according to claim 1 wherein said metal electrode film exhibits gas barrier characteristics.

* * * * *